(12) United States Patent
Hung et al.

(10) Patent No.: US 7,914,323 B2
(45) Date of Patent: Mar. 29, 2011

(54) CONNECTOR APPARATUS

(75) Inventors: Wen-Hsiang Hung, Taipei Hsien (TW); Lei Shen, Shenzhen (CN); Zhen-Xing Wu, Shenzhen (CN); Jun-Jie Zheng, Shenzhen (CN); Yong-Hua Xiao, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 27 days.

(21) Appl. No.: 12/341,991

(22) Filed: Dec. 22, 2008

(65) Prior Publication Data
US 2010/0136825 A1 Jun. 3, 2010

(30) Foreign Application Priority Data
Nov. 28, 2008 (CN) .......................... 2008 1 0305860

(51) Int. Cl.
*H01R 13/60* (2006.01)

(52) U.S. Cl. ..................................................... 439/540.1
(58) Field of Classification Search ............... 439/540.1, 439/521, 701
See application file for complete search history.

(56) References Cited

U.S. PATENT DOCUMENTS

| | | | | |
|---|---|---|---|---|
| 4,220,391 A | * | 9/1980 | Krolak et al. | 439/540.1 |
| 4,946,401 A | * | 8/1990 | Hori et al. | 439/224 |
| 5,131,558 A | * | 7/1992 | Hiromori | 220/326 |
| 5,671,273 A | * | 9/1997 | Lanquist | 379/413.04 |
| 5,890,933 A | * | 4/1999 | Okabe | 439/701 |

* cited by examiner

*Primary Examiner* — Briggitte R Hammond
*Assistant Examiner* — Larisa Z Tsukerman
(74) *Attorney, Agent, or Firm* — Zhigang Ma

(57) ABSTRACT

A connector apparatus includes a main body and a cover. The main body includes a fixed member and a receiving member. A plurality of connectors is fixed in the fixed member. The receiving member is configured for receiving another connector. The cover is detachably mounted to the receiving member to cover the another connector in response to the another connector being installed in the receiving member.

16 Claims, 5 Drawing Sheets

CONNECTOR APPARATUS

BACKGROUND

1. Technical Field

The disclosure relates to connector apparatuses and, more particularly, to a connector apparatus for an electronic device.

2. Description of Related Art

A connector is a kind of intermedium for electronically connecting two electronic devices together, to transmit signals between the electronic devices. An electronic device usually requires a plurality of connectors. To reduce cost of connectors, modular connector apparatuses, which integrate a plurality of connectors together, has been introduced. However, when one of the connectors of the modular connector apparatus is damaged, the whole modular connector apparatus needs to be replaced, which is wasteful.

DETAILED DESCRIPTION

Figure 1:
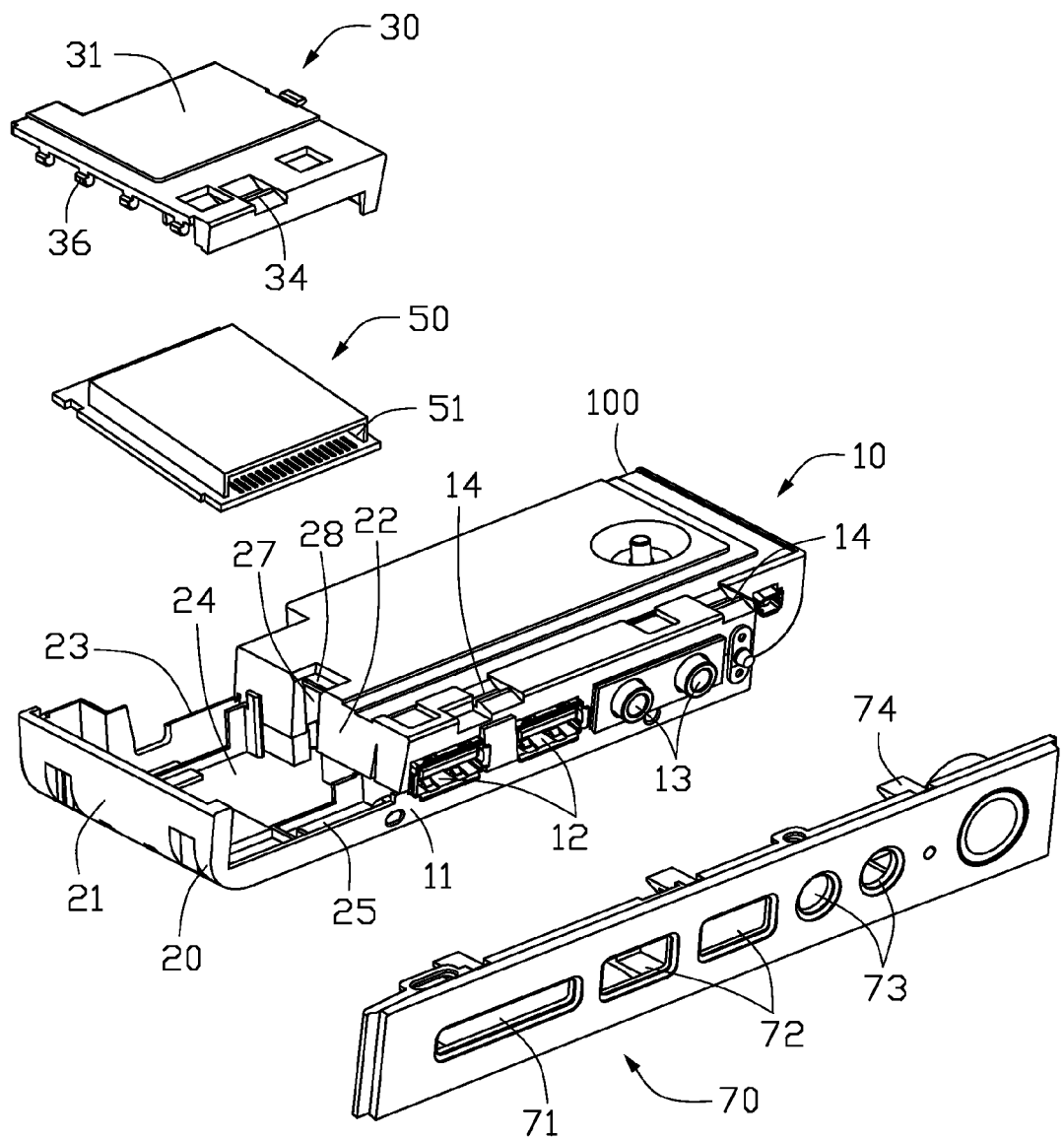
FIG. 1 is an exploded, isometric view of an exemplary embodiment of a connector apparatus.
Figure 2:
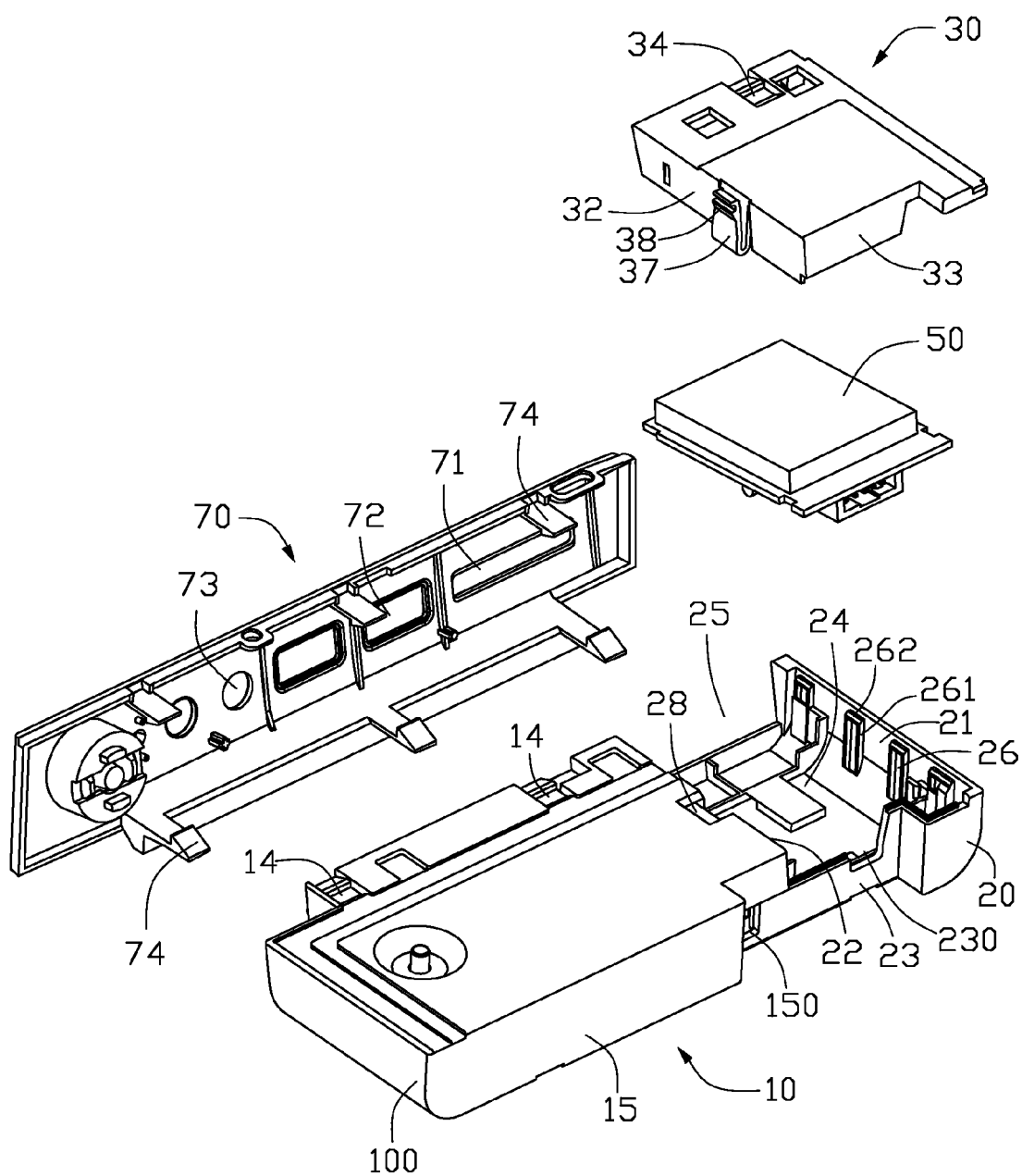
FIG. 2 is similar to FIG. 1, but viewed from another perspective.

Referring to FIGS. 1 and 2, an exemplary embodiment of a connector apparatus includes a main body 10, a cover 30, a first connector 50, and a front panel 70. The connector apparatus is to be mounted to an electronic device, such as a computer or a monitor, configured for connecting with external devices.

The main body 10 is generally cuboid-shaped and includes a fixed member 100 formed at a first end of the main body 10, and a receiving member 20 formed at an opposite second end of the main body 10. Two second connectors 12 and two third connectors 13 are firmly mounted to the fixed member 100. The receiving member 20 is configured for receiving the first connector 50.

Ports of the second connectors 12 and third connectors 13 are exposed from the front of the fixed member 10. A wire hole 150 is defined in the back of the fixed member 10, and is configured for wires passing therethrough to electrically connect the second connectors 12 and the third connectors 13 with a circuit board of the electronic device. A plurality of clasping portions 14 is formed on the top and the bottom of the fixed member 10, adjacent to the front of the fixed member 10.

The receiving member 20 includes a bottom wall 24 aligned with the bottom of the fixed member 10, a first sidewall 21 perpendicularly extending upward from the bottom wall opposite to the fixed member 100 and perpendicular with the front of the fixed member 10, a second sidewall 22 adjacent to the fixed member 100 and opposite to the a first sidewall 21, and a rear wall 23 perpendicularly extending upward from the rear side of the bottom wall 24 and perpendicularly connected between the first sidewall 21 and the second sidewall 22. An opening 25 is defined in the front of the receiving member 20. The bottom wall 24, the first sidewall 21, the second sidewall 22, and the rear wall 23 bound a receiving space for receiving the first connector 50.

Another clasping portion (not shown) is formed on an outer surface of the bottom wall 24 of the receiving member 20 adjacent to the opening 25.

A plurality of first snapping portions 26 (also shown in FIG. 5) is formed on an inner side of the first sidewall 21. Each first snapping portion 26 includes two spaced first raised bars 261 extending from the inner side of the first sidewall 21 and perpendicular with the bottom wall 24, and a second raised bar 262 extending from the inner side of the first sidewall 21 between the first raised bars 261 and parallel with the bottom wall 24. The second raised bar 262 connects between top ends of the first raised bars 261.

A second snapping portion is formed on an inner side of the second sidewall 22. The second snapping portion includes a groove 27 defined in the second sidewall 22, and a plate 28 extending into the groove 27 from a portion bounding the groove 27 and parallel with the bottom wall 24.

A wire hole 230 is defined in the rear wall 23, and is configured for a wire passing therethrough to electrically connect the first connector 50 with the circuit board of the electronic device, when the first connector 50 is installed in the receiving member 20.

The cover 30 includes a top board 31, a rear board 33 extending downward from the rear end of the top board 31, a side board 32 extending downward from a first side of the top board 31. A clasping portion 34 is formed on the outer surface of the top board 31 adjacent to the front end of the top board 31. A plurality of hooks 36 extends downward from a second side of the top board 31 opposite to the first side of the top board 31. An elastic clipping unit extends down from the first side of the top board 31. In one embodiment, the elastic clipping unit is a U-shaped elastic piece 37. The elastic piece 37 includes an F-shaped clipping portion 38 formed from a free end of the elastic piece 37 (shown also in FIG. 5). A middle portion of the side board 32 defines a hole (not labeled) therein for avoiding interference with the elastic piece 37.

A port 51 is located at the front of the first connector 50.

The front panel 70 is to be mounted to the front of the main body 10, and is configured for protecting the main body 10. The front panel 70 defines a first access hole 71, two second access holes 72, and two third access holes 73. A plurality of elastic claws 74 extends backward from an upper side and a lower side of the front panel 70.

Figure 3:
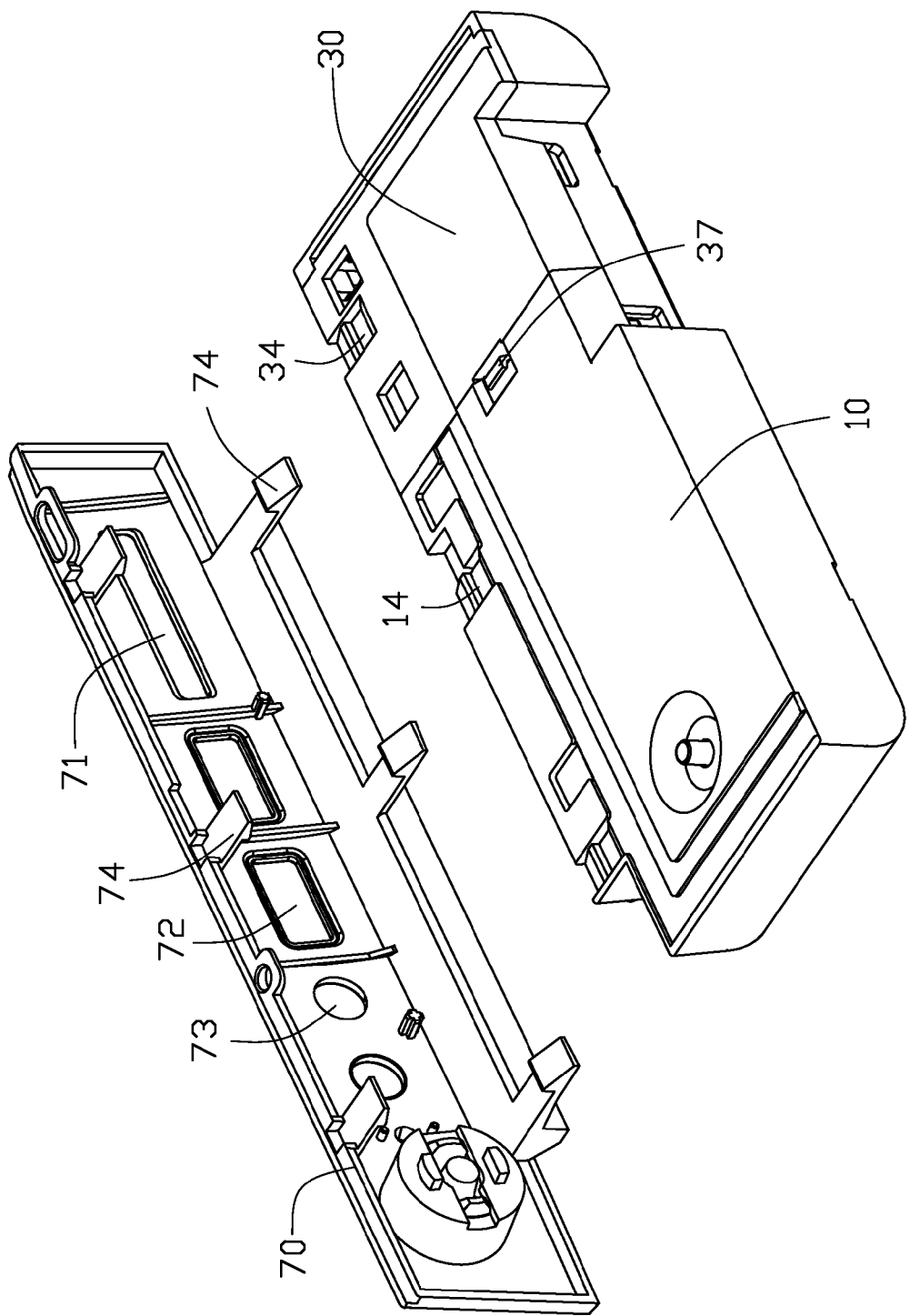
FIG. 3 is a partly assembled view of FIG. 2.
Figure 4:
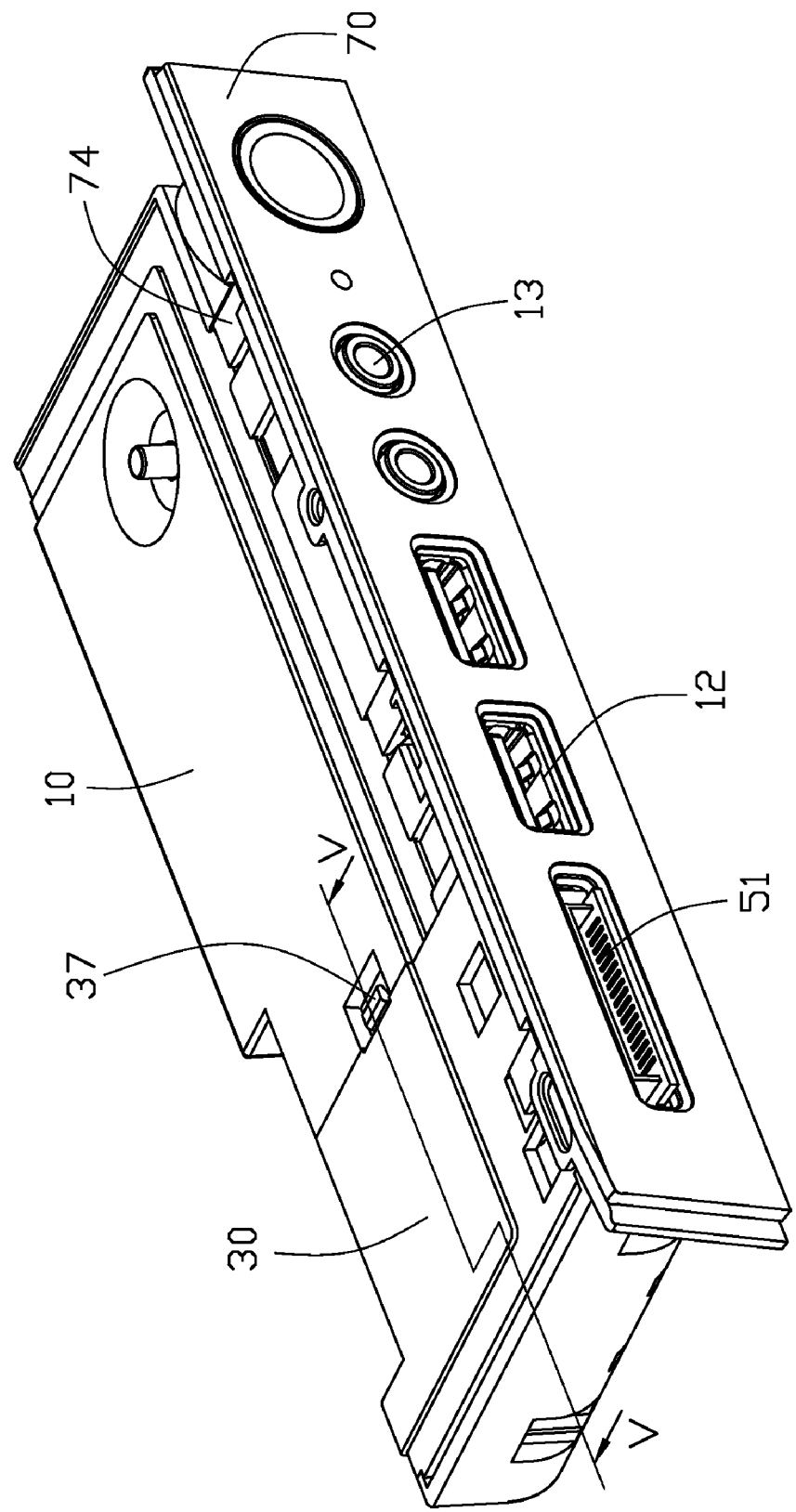
FIG. 4 is an assembled view of FIG. 1.

Referring to FIGS. 3 and 4, in assembly, the first connector 50 is received in the receiving member 20 of the main body 10, with the port 51 exposing through the opening 25. The cover 30 is mounted to the receiving member 20 to cover the first connector 50. The front panel 70 is mounted to the front side of the main body 10 via the claws 74 catching the clasping portions 14 and 34, respectively. Wherein the first access hole 71, the second access holes 72, and the third access holes 73 are corresponding to the first connector 51, the second connectors 12, and the third connectors 13, respectively, configured for the connector 50, 12 and 13 being accessed.

Figure 5:
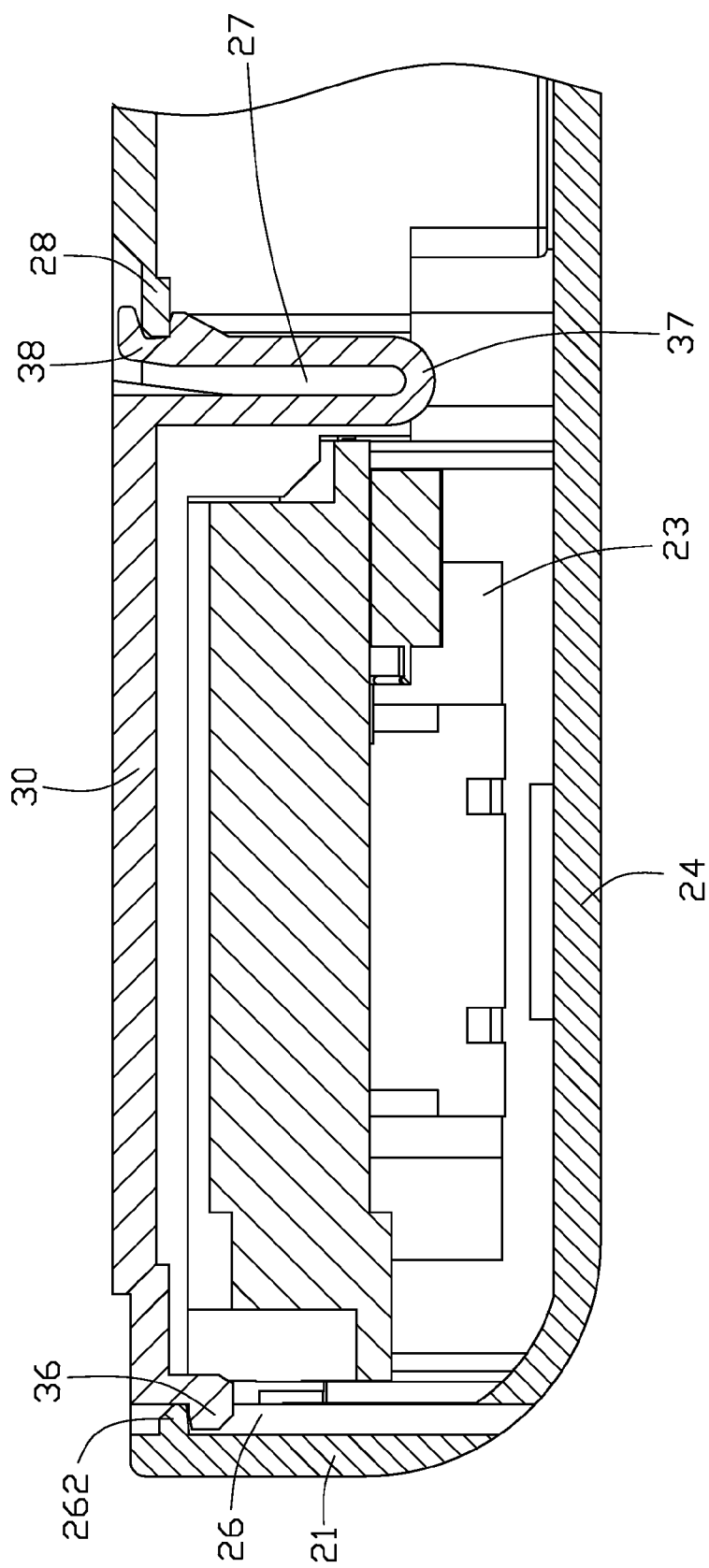
FIG. 5 is a partial, cross-sectional view, taken along the line V-V of FIG. 4.

Referring to FIG. 5, in mounting the cover 30, the cover 30 is suspended over the receiving member 20 and parallel with the bottom wall 24. The elastic piece 37 is adjusted to be in alignment with the groove 27, and the cover 30 is pressed down. The elastic piece 37 is inserted in the groove 27, thus the elastic piece 37 firstly contacts with the plate 28 and then is deformed by the plate 28 until the clipping portion 38 catches the plate 28. When the elastic piece 37 is inserted in the groove 27, the hooks 36 go over the second raised bars 262 to engage in the corresponding first snapping portions 26, catching the second raised bars 262.

In disassembly, the claws 74 are operated to disengage from the clasping portions 14 and 34, and the front panel 70 can be detached from the main body 10. The clipping portion 38 of the elastic piece 37 is pushed toward the top board 31 to be disengaged from the plate 28. The cover 30 is rotated relative to the first snapping portions 26 to be lifted to make the elastic piece 37 disengage from the groove 27. Thus, the cover 30 is ready to be detached from the main body 10, and the first connector 50 can be taken out.

In one embodiment, the first connector 50 is a card reader, which is flimsier and has shorter working life than the second connectors 12 and the third connectors 13. The connector apparatus of the disclosure is partly detachable for the first connector 50, so that the connector apparatus can be partly replaced instead of whole replaced, which reduces the cost of replacement. Furthermore, in some electronic devices, the first connector 51, such as the expensive card reader, is not needed. Thus, in manufacturing the connector apparatus, the first connector 50 can be simply omitted without a need to re-design of the connector apparatus as would otherwise be necessary before, which reduces the cost of design and manufacture.

In other embodiments, another way may be used to attached the cover 30 to the receiving member 20, such as using screws to fix the cover 30 to the receiving member 20.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector apparatus comprising:
a main body comprising a fixed member, and a receiving member, wherein a plurality of connectors is fixed in the fixed member, the receiving member is configured for detachably receiving another connector, an opening is defined in a front end of the receiving member, configured for a port of the another connector being exposed; and
a cover detachably mounted to a top side of the receiving member to cover the another connector in response to the another connector being installed in the receiving member, wherein the top side is not directly opposite to the front end;
wherein the receiving member comprises a bottom wall, a first sidewall extending upward from the bottom wall, and a second sidewall opposite to the first sidewall, a plurality of first snapping portions forms in an inner side of the first sidewall, a second snapping portion forms in an inner side of the second sidewall, the cover comprises a top board, a plurality of hooks extends downward from a first side of the top board, an elastic clipping unit extends down from a second side of the top board; wherein the plurality of hooks are clipped in the plurality of first snapping portions respectively, and the elastic clipping unit is clipped in the second snapping portion in response to the cover being mounted to the receiving member.

2. The connector apparatus of claim 1, wherein the elastic clipping unit is a U-shaped elastic piece, the elastic piece comprises a clipping portion formed from a free end of the elastic piece, the second snapping portion includes a groove defined in the second sidewall, and a plate extending into the groove from a portion bonding the groove, the elastic piece is received in the groove, and the clipping portion catches the plate in response to the cover being mounted to the receiving member.

3. The connector apparatus of claim 2, wherein clipping portion is F-shaped, and the plate is parallel with the bottom wall.

4. The connector apparatus of claim 1, wherein each of the plurality of first snapping portions comprises two spaced first raised bars extending from the inner side of the first sidewall and perpendicular with the bottom wall, and a second raised bar extending from the inner side of the first sidewall between the first raised bars and parallel with the bottom wall, wherein the plurality of hooks engage in the plurality of first snapping portions respectively, and catch the corresponding second raised bars in response to the cover being mounted to the receiving member.

5. The connector apparatus of claim 1, further comprising a front panel, wherein the front panel is detachably mounted to a front side of the main body, configured for protecting the main body, wherein a plurality of access holes are defined in the front panel, configured for the plurality of connectors and the another connector being accessed.

6. The connector apparatus of claim 5, wherein a plurality of clasping portions form in a top and a bottom of the main body, another clasping portion forms in an outer surface of the top board of the cover, a plurality of elastic claws extend backward from an upper side and a lower side of the front panel, the front panel is capable of being mounted to the front side of the main body via the claws catching the clasping portions, respectively.

7. A connector apparatus comprising:
a main body comprising a fixed member, and a receiving member, wherein a first connector is fixed in the fixed member, a receiving space is defined in the receiving member, an opening is defined in a front end of the receiving member, and communicating with the receiving space;
a second connector capable of being received in and taken out of the receiving space, and comprising a port exposed from the opening of the receiving member in response to the second connector being received in the receiving space; and
a cover being mounted to a top side of the receiving member to cover the receiving space with or without the second connector received therein;
wherein the receiving member comprises a bottom wall, a first sidewall extending upward from the bottom wall, and a second sidewall opposite to the first sidewall, a first snapping portion forms in an inner side of the first sidewall, a second snapping portion forms in an inner side of the second sidewall, the cover comprises a top board, a hook extends downward from a first side of the top board, an elastic clipping unit extends down from a second side of the top board, wherein the hook is clipped in the first snapping portion, and the elastic clipping unit is clipped in the second snapping portion.

8. The connector apparatus of claim 7, wherein the elastic clipping unit is a U-shaped elastic piece, the elastic piece comprises a clipping portion extending from a free end of the elastic piece, the second snapping portion includes a groove defined in the second sidewall, and a plate extending into the groove from a portion bonding the groove, wherein the elastic piece is received in the groove, and the clipping portion catches the plate.

9. The connector apparatus of claim 8, wherein clipping portion is F-shaped, and the plate is parallel with the bottom wall.

10. The connector apparatus of claim 7, wherein the first snapping portion comprises two spaced first raised bars extending from the inner side of the first sidewall and perpendicular with the bottom wall, and a second raised bar extending from the inner side of the first sidewall between the first raised bars and parallel with the bottom wall, wherein the hook engages in the first snapping portion, and catches the second raised bar.

11. The connector apparatus of claim 7, further comprising a front panel, wherein the front panel is detachably mounted to a front side of the main body, configured for protecting the main body, wherein a plurality of access holes is defined in the front panel, configured for the first and second connectors being accessed.

12. The connector apparatus of claim 11, wherein a plurality of clasping portions forms on a top and a bottom of the main body, another clasping portion forms on an outer surface of the top board of the cover, a plurality of elastic claws extends backward from an upper side and a lower side of the front panel, the front panel is capable of being mounted to the front side of the main body via the claws catching the clasping portions, respectively.

13. A connector apparatus comprising:
a main body comprising a fixed member and a receiving member, and a receiving space is defined in the receiving member;
a first connector fixed in the fixed member,
a second connector capable of being received in and taken out of the receiving space; and
a cover capable of covering the receiving space with or without the second connector received therein;
wherein the receiving member comprises a bottom wall, a first sidewall extending upward from the bottom wall, and a second sidewall opposite to the first sidewall, a first snapping portion forms in an inner side of the first sidewall, a second snapping portion forms in an inner side of the second sidewall, the cover comprises a top board, a hook extends downward from a first side of the top board, an elastic clipping unit extends down from a second side of the top board, wherein the hook is clipped in the first snapping portion, and the elastic clipping unit is clipped in the second snapping portion,
wherein the elastic clipping unit is a U-shaped elastic piece comprising a clipping portion extending from a free end of the elastic piece, the second snapping portion comprises a groove defined in the second sidewall and a plate extending into the groove from a portion bonding the groove, wherein the elastic piece is received in the groove, and the clipping portion catches the plate.

14. The connector apparatus of claim 13, wherein the first snapping portion comprises two spaced first raised bars extending from the inner side of the first sidewall and perpendicular with the bottom wall, and a second raised bar extending from the inner side of the first sidewall between the first raised bars and parallel with the bottom wall, wherein the hook engages in the first snapping portion, and catches the second raised bar.

15. The connector apparatus of claim 13, further comprising a front panel detachably mounted to a front side of the main body to protect the main body, wherein a plurality of access holes is defined in the front panel for access to the first and second connectors.

16. The connector apparatus of claim 15, wherein a plurality of clasping portions forms on a top and a bottom of the main body, another clasping portion forms on an outer surface of the top board of the cover, a plurality of elastic claws extends backward from an upper side and a lower side of the front panel, and the front panel is capable of being mounted to the front side of the main body via the claws catching the clasping portions, respectively.

* * * * *